(12) United States Patent  
Bierer

(10) Patent No.: US 7,336,063 B1  
(45) Date of Patent: Feb. 26, 2008

(54) VOLTAGE DETECTOR

(76) Inventor: Walter S. Bierer, 183 Elton Walker Rd., Blythewood, SC (US) 29016

( * ) Notice: Subject to any disclaimer, the term of this patent is extended or adjusted under 35 U.S.C. 154(b) by 0 days.

(21) Appl. No.: 11/636,730

(22) Filed: Dec. 11, 2006

(51) Int. Cl.
*G01R 17/06* (2006.01)

(52) U.S. Cl. .................... 324/99 D; 324/72.5

(58) Field of Classification Search ............. None
See application file for complete search history.

(56) References Cited

U.S. PATENT DOCUMENTS 6,242,903 B1 * 6/2001 Klingberg et al. .......... 324/149
6,753,678 B2 * 6/2004 Bierer ........................ 324/141

* cited by examiner

*Primary Examiner*—Minh N. Tang

(74) *Attorney, Agent, or Firm*—Michael A. Mann; Nexsen Pruet, LLC

(57) ABSTRACT

A voltage detector that more accurately measures AC voltage of a voltage conductor by correcting the voltage detected directly by the detector's contact probe to account for the conductor's size and shape. The housing of the detector has plural non-contact electrode sensors spaced apart over its surface for sensing capacitive charging currents in the detector's vicinity. By combining voltages sensed by these electrode sensors to the probe's measured voltage, the detector can correct the contact probe measurement for voltages that bypass the contact probe or other conductors in the vicinity that product their own capacitive charging currents. A microprocessor in the housing of the present detector adds or subtracts sensed voltages depending on whether they are input or output voltages, respectively.

11 Claims, 6 Drawing Sheets

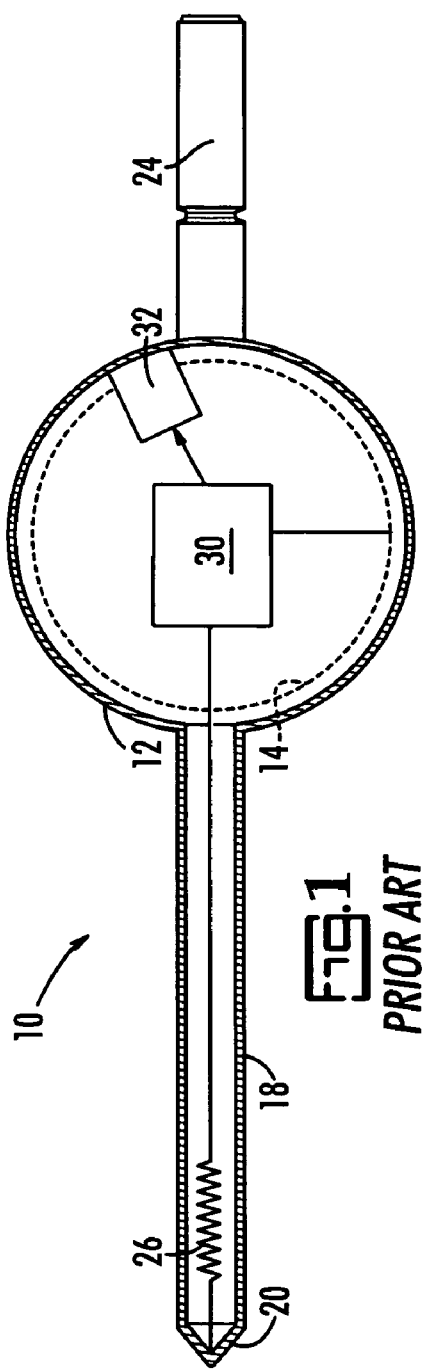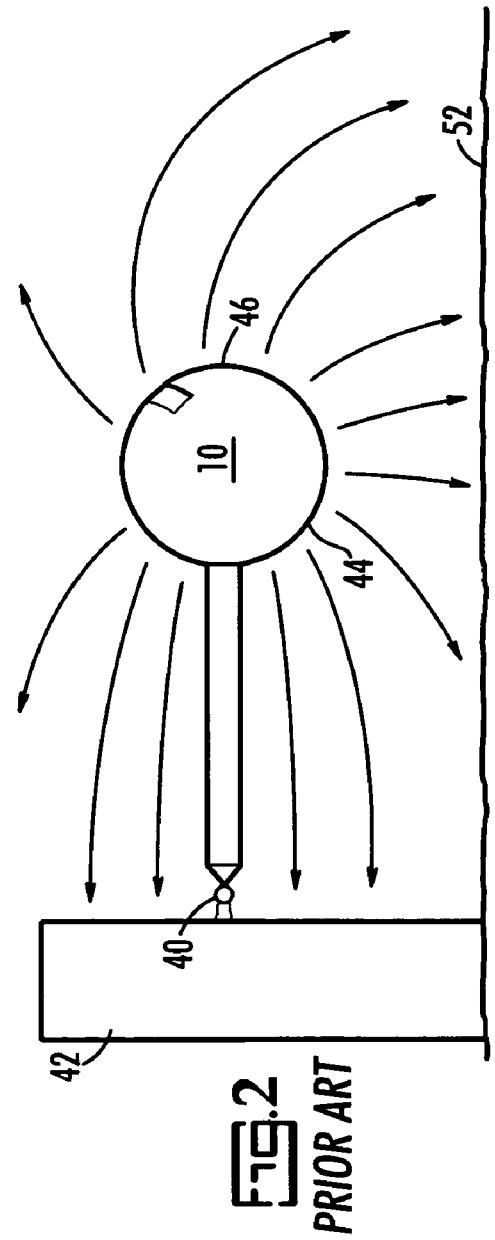
FIG. 1
PRIOR ART
FIG. 2
PRIOR ART

VOLTAGE DETECTOR

CROSS REFERENCE TO RELATED PATENTS

Not applicable.

BACKGROUND OF THE INVENTION

The present invention relates to a high voltage measurement and, more particularly, to a high voltage detector that can be used for measuring voltages in high voltage alternating current (AC) circuits or systems with improved accuracy.

A voltage detector is a form of voltmeter that measures voltages without the use of a ground lead. The ground lead is avoided in situations where it would present a severe safety risk to the operator of the voltage detector. Typically, voltage detectors are used by those measuring high AC voltages such as electrical power utility linemen. Before the present invention, designers of voltage detectors assumed that the magnitude of the alternating current being measured by a voltage detector was a function of three things: (1) the internal impedance of the device; (2) the external capacitive reactance between the device and electrical ground or nearby electrical grounded conductors and equipment; and (3) the magnitude of the voltage being measured, that is, the voltage carried through the high voltage conductor. See for example, U.S. Pat. No. 6,753,678, which is incorporated herein in its entirety by reference, for further information about voltage detectors.

However, even when these three factors are accommodated in the voltage detector design, typical prior art voltage detectors are still not very accurate, ranging from up to 10% below to 50% above the true voltage. Thus there remains a need for a voltage detector having improved accuracy.

SUMMARY OF THE INVENTION

According to its major aspects and broadly stated, the present invention is a voltage detector that more accurately measures AC voltages. The improvements to the voltage detector are based on the accommodation of an important fourth influence on the accuracy of the voltage measurement, namely, the size and shape of the voltage conductor. In order to correct the voltage measurement for this fourth influence, and achieve significant improvement in accuracy, the present invention uses multiple non-contact input/output sensors deployed over the surface of the detector housing. These sensors evaluate the physical shape and size of the voltage source being measured, and detect nearby electric fields of adjacent phase conductors or ground conductor in a three phase electric system. The voltages these non-contact sensors detect are used to correct the voltage being measured by the direct contact probe to offset the distorting effect of the size and shape of the electrical conductor (and adjacent conductors and grounds) on that direct measurement.

The physical shape and size of a voltage source will generally fall into one of three categories: (1) a point source, (2) a long wire, or (3) two-dimensional conductors. A typical point source voltage could be an insulated high voltage bushing protruding from the front portion of an electrically grounded all steel transformer case. A typical long wire could be a bare wire suspended between and insulated from its supporting structures. A two-dimensional conductor could be a large bus-bar suspended between and insulated from its supporting structures.

Generally stated, with the physical parameters of a voltage detector remaining constant, the smaller the physical size of an AC voltage source, the greater the current through the voltage detector and the higher and more accurate the apparent voltage indication by the direct contact probe. The reverse is of course also true, namely, the larger the physical size of the AC voltage source, the less current that will pass through the voltage detector probe and the lower will be the voltage indication by the detector. Since no source is a true point source, the present voltage detector uses additional, non-contact electrodes to detect current that is bypassing the detector probe and, with the assistance of a microprocessor, correct the voltage to offset the influence of its size and shape on the measurement.

The addition of multiple non-contact input/output sensors supplements the primary probe to detect nearby electric fields that indicate the presence of an adjacent phase conductor or ground conductor, such as would be found in a three phase electric system.

These and other features and their advantages will be apparent to those skilled in the art of voltage measurement and detection from a careful reading of the Detailed Description of Preferred Embodiments accompanied by the following drawings.

BRIEF DESCRIPTION OF THE SEVERAL VIEWS OF THE DRAWINGS

In the drawings,

FIG. 1 depicts schematically a prior art voltage detector;

FIG. 2 illustrates the effects of the electric field of a point source on a prior art voltage detector;

DETAILED DESCRIPTION OF THE INVENTION

Figure 3:
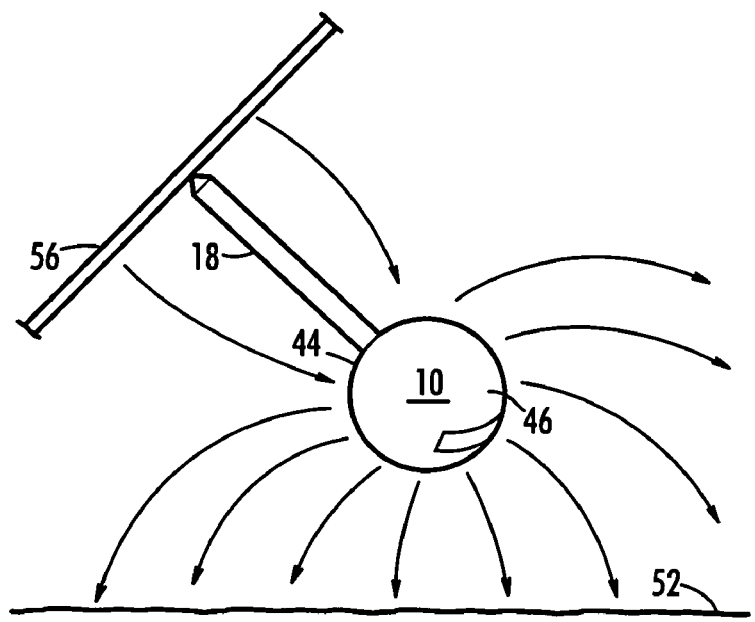
FIG. 3 illustrates the effects of the electric field of a long wire on a prior art voltage detector.

The present invention is a voltage detector which is a voltage meter without a ground lead. The present voltage detector is an improvement over prior art voltage detectors in that it corrects the apparent voltage of a voltage source for the size and shape of the source as well as the presence of other conductors and grounds in the vicinity of the voltage detector during measurement.

Referring now to the figures, FIGS. 1-4 represent a prior art voltage detector shown in a schematic form and generally indicated by reference number 10. Detector 10 is shown in FIG. 1 in partial cross section to reveal its internal components schematically shown. Detector 10 has a housing 12 that is made of a non-conducting material and has electromagnetic shielding 14 inside to protect its internal components from electromagnetic radiation. Detector has an electrode probe 18 with a conducting tip 20 and an opposing handle 24 for use by an operator. Tip 20 is connected electrically through a high voltage dropping resistor 26 to processing circuitry 30 and a display 32. Processing circuitry is connected electrically to shielding 14. Dropping resistor is typically rated at about 25 mega-Ohms.

When tip 20 of electrode probe 18 is brought into contact with an electrical conductor by an operator using handle 24, the voltage sensed by tip 20 is reduced by resistor 26 and fed to processing circuitry 30, which processes the analog signal, conditions it and converts it to a digital signal for display as a digital voltage on display 32. Detectors generally along the lines described in connection with detector 10 as shown in FIG. 1 have been in widespread use for well over fifty years.

Figure 4:
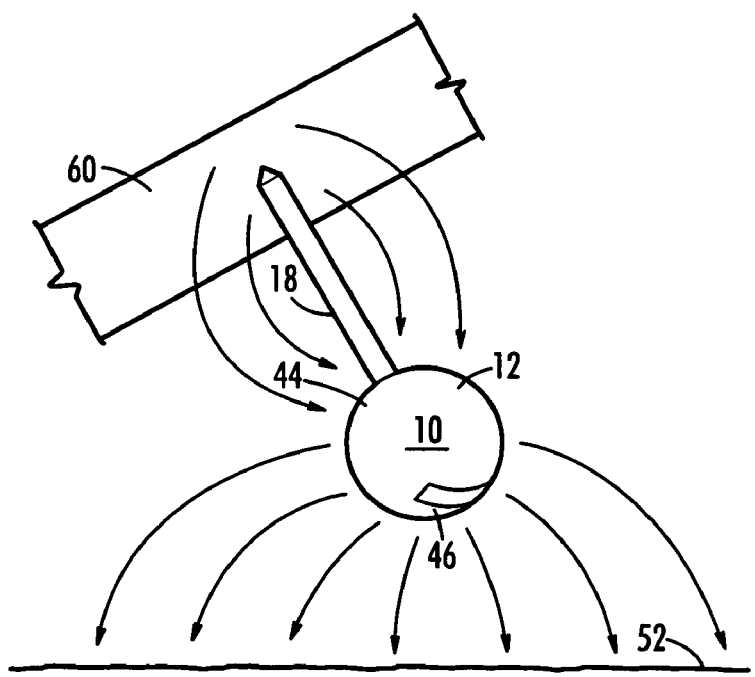
FIG. 4 illustrates the effects of the electric field of a physically large bus on a voltage detector.

FIGS. 2-4 illustrate the prior art voltage detector of FIG. 1 being used to detect voltage from three different sources of voltage. These figures include the field lines that run between the detector and various surfaces in its vicinity. For convenience, the structures common to FIGS. 1-4 use the same reference numbers. In FIG. 2, detector 10 is shown detecting voltage from a point source 40. Electrode probe 18 is in contact with point source 40. Point source 40 is an insulated bushing protruding from a large electrically grounded all steel transformer case 42. The direction of the electric field from housing 12 of voltage detector 10 couples to all of its surroundings including grounded transformer case 42. Since point source 40 is a source of an alternating current electric field and thus surrounded by an electromagnetic field, the AC capacitive charging current emanates from the front portion 44 of voltage detector 10 to grounded transformer case 42 as well as from the back 46 of housing 12 to ground 52, as shown by field lines in FIG. 2.

FIG. 3 illustrates voltage detector 10 detecting a voltage while being held perpendicular to and touching a long wire 56. Electrode probe 18 is in contact with long wire 56. The electric field as indicated by field lines now run both to and from housing 12 of voltage detector 10. Two lines, one on either side of probe 18, run to housing; the remainder runs from housing. The electric field from long wire 56 is now coupling directly into front portion 44 of voltage detector 10, bypassing probe 18 and its dropping resistor 26, while the electric field from back 46 of voltage detector 10 is coupling to ground 52.

FIG. 4 illustrates voltage detector 10 detecting a voltage while being held perpendicular to a physically large bus bar 60. Electrode probe 18 is placed in contact with bus bar 60. The strength of the electric field coupled into front portion 44 of housing 12 is now even greater than that produced by long wire 56 as indicated by additional field lines running to housing 12 of detector 10. Because bus bar 60 is a source of AC voltage and thus surrounded by an AC electric field, the AC capacitive charging current into front portion 44 of the housing 12 will be broader than that of long wire 56. The result is that some of the AC capacitive charging current entering front portion 44 of the housing 12 will bypass high voltage dropping resistor 26, resulting in less current into processing circuitry 30 and a lower voltage indication on display 32.

Figure 5A:
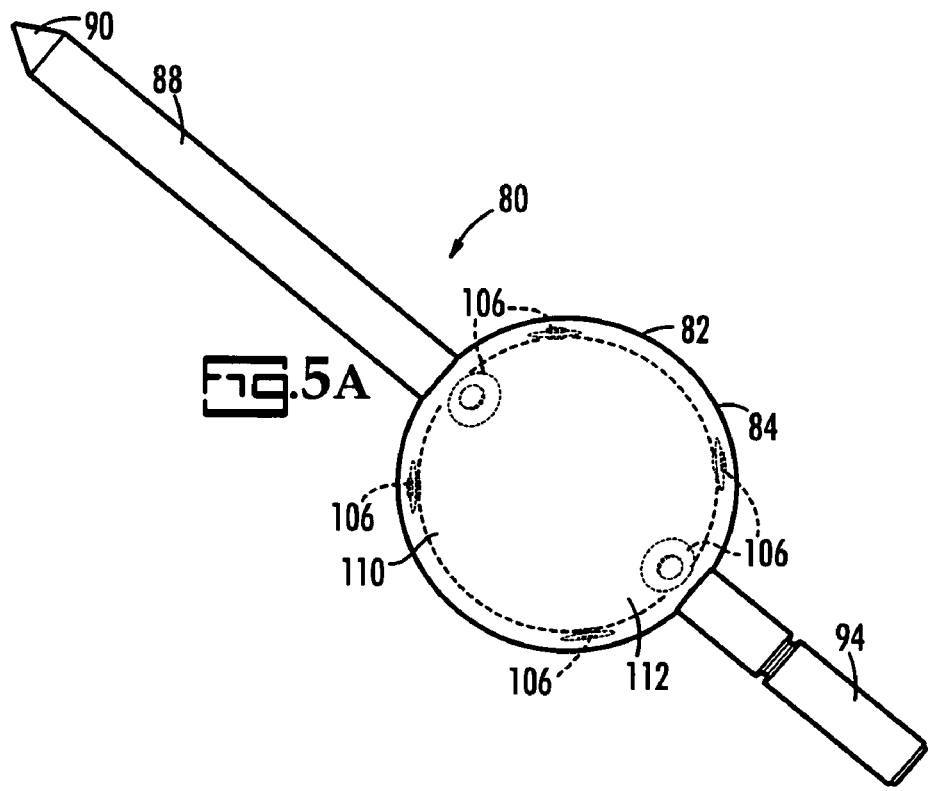
FIG. 5A illustrates an external view of a voltage detector with multiple input electrodes, according to a preferred embodiment of the present invention.
Figure 5B:
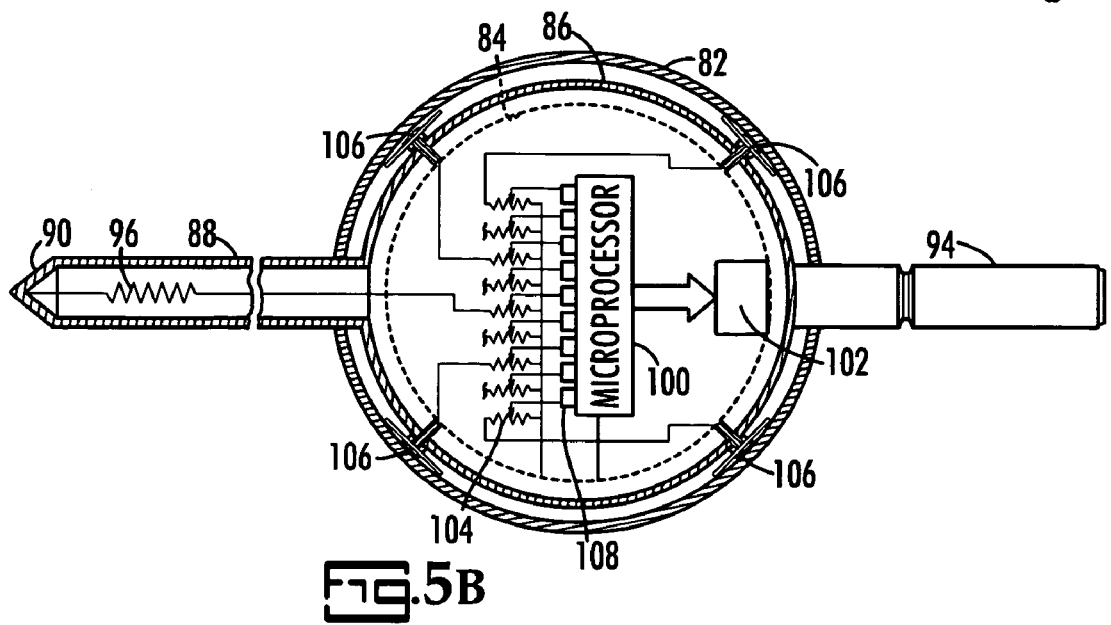
FIG. 5B illustrates a cross sectional, schematic view of the voltage detector of FIG. 5a, according to a preferred embodiment of the present invention.

FIGS. 5A and 5B illustrate external and cross sectional views of a present voltage detector 80 which represents an improvement over voltage detector 10. Like voltage detector 10, it consists of a housing 82 made of a non-electrically conducting material having electromagnetic shielding 84 inside housing 82 to protect the contents of housing 82 from the electromagnetic environment of detector 80. Housing 82 has a protective, non-conducting shell 86 around it.

Detector 80 has a probe 88 with an electrically conducting tip 90 on one end and a handle 94 on the opposing end. Tip 90 is in electrical connection via a high voltage dropping resistor 96 for direct contact with a high voltage source. As with detector 10, dropping resistor 96 is typically rated at about 25 mega-Ohms. The primary input from tip 90 of probe 88 is fed to a microprocessor 100 wherein the analog signal is conditioned, converted to a digital signal, and then adjusted to compensate for the size and shape of the voltage source, as will be described below, and then displayed on digital display 102.

In addition to these components, detector 80 has plural secondary electrode sensors 106 mounted on support structure 86. These secondary electrode sensors 106 are deployed below the surface of non-conducting housing 82 but above the shielding so as to purposefully expose the secondary electrode sensors 106 to the external electric fields present. Preferably, housing 82 has a front surface 110 positioned toward the voltage source and a back surface 112 positioned away from the voltage source with plural electrode sensors 106 on front surface 110 and plural electrode sensors 106 on back surface 112. Electrode sensors 106 are preferably spaced apart over the surface of housing 82 so that they can detect electromagnetic fields about a full 360 spherical degrees of detector 80. Housing 82 is described as having front surface 110 and back surface 112. Detector 80 is shown in the figures as having a spherical shape, there is no particular shape that is preferred or required. For example, a rectangular shape will also be suitable and can have electrodes 106 on its lateral faces.

Each electrode sensor 106 has its own voltage divider network 104 that is adjustable in order to be able to scale the voltage fed to microprocessor 100. Electrode sensors 106 are bi-directional and thus capable of input or output signal delivery depending on whether the electromagnetic field in the vicinity of sensors 106 is in phase or is out of phase, respectively, with that of the primary signal being detected by electrode probe 88. The output of microprocessor 100 is a voltage signal to display 102 that includes the signal from probe 88 corrected by each of the non-contract sensors 106 detecting current. The extent of the correction is related to the strength of the current each detects which in turn is related to the size of the conductor and the presence of other fields.

Figure 6:
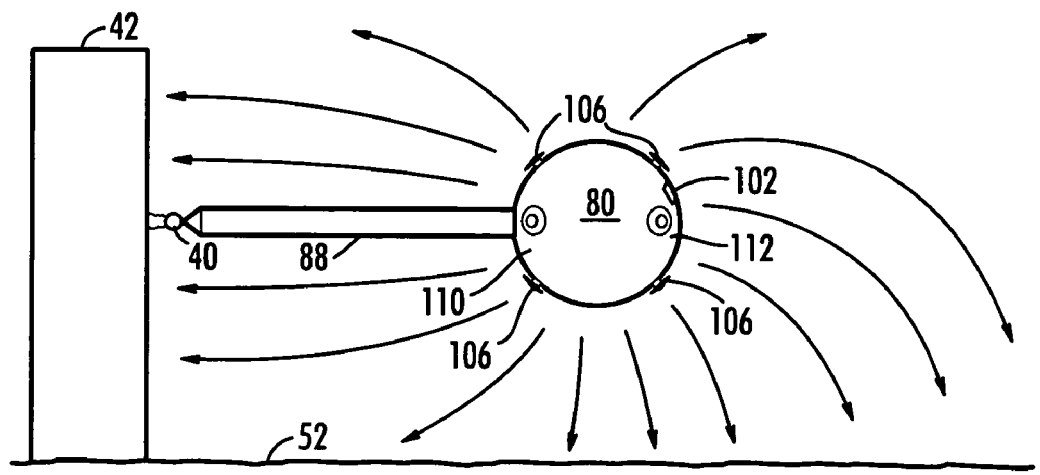
FIG. 6 illustrates the effects of the electric field of a point source on a voltage detector, according to a preferred embodiment of the present invention.
Figure 7:
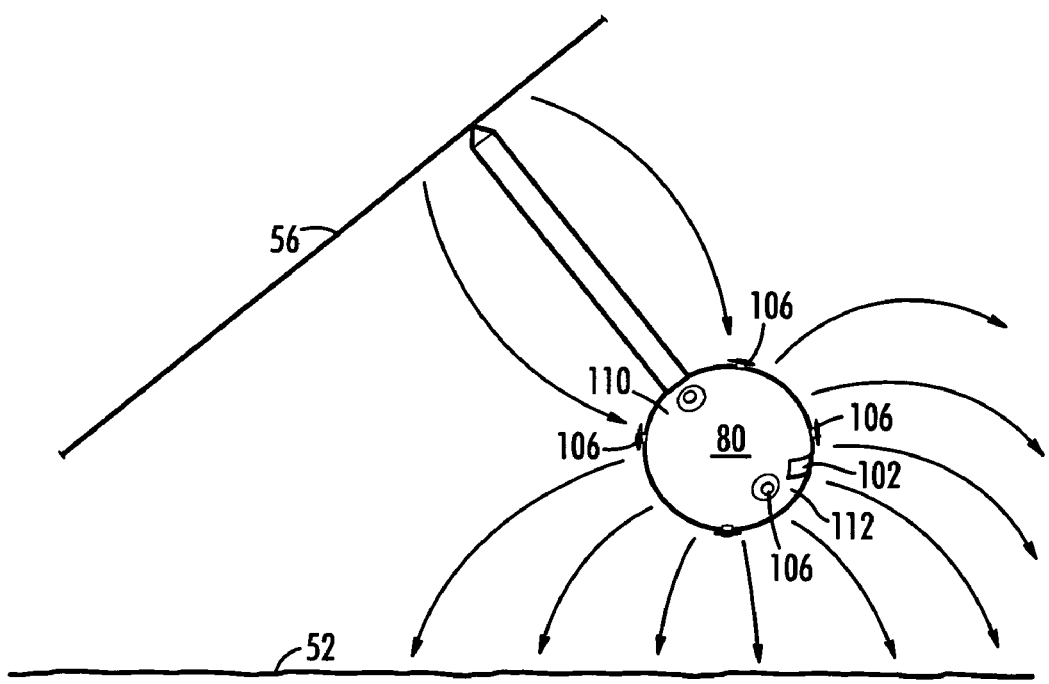
FIG. 7 illustrates the effects of the electric field of a long wire on a voltage detector, according to a preferred embodiment of the present invention.
Figure 8:
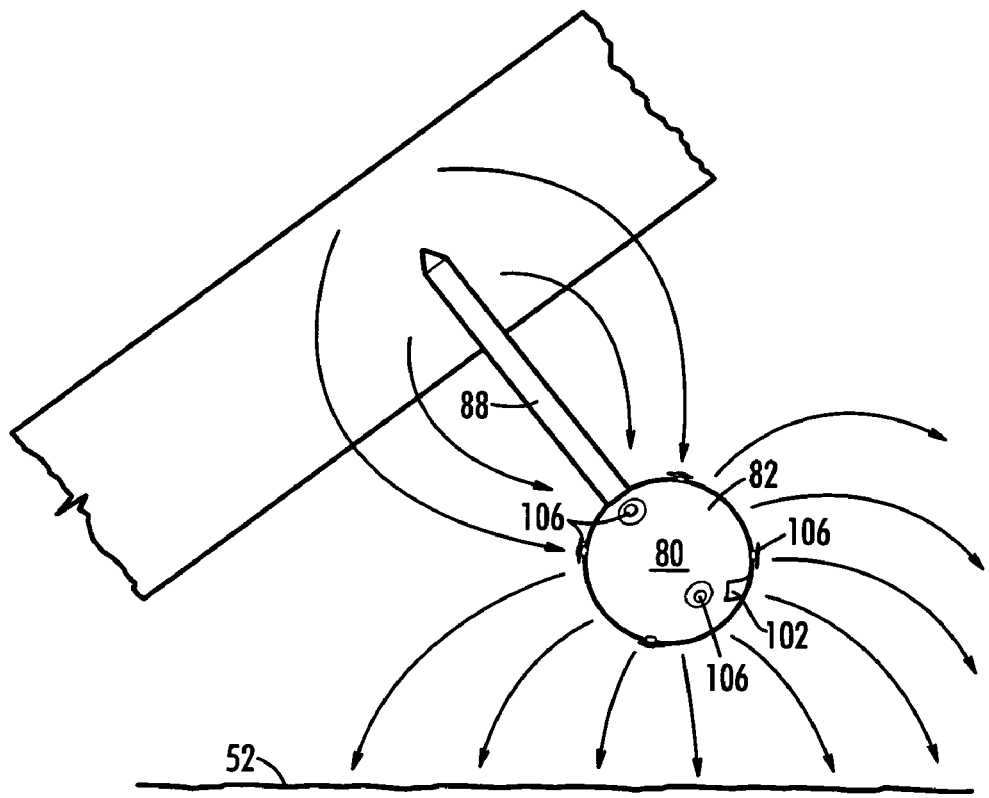
FIG. 8 illustrates the effects of the electric field of a large bus bar on a voltage detector, according to a preferred embodiment of the present invention.
Figure 9:
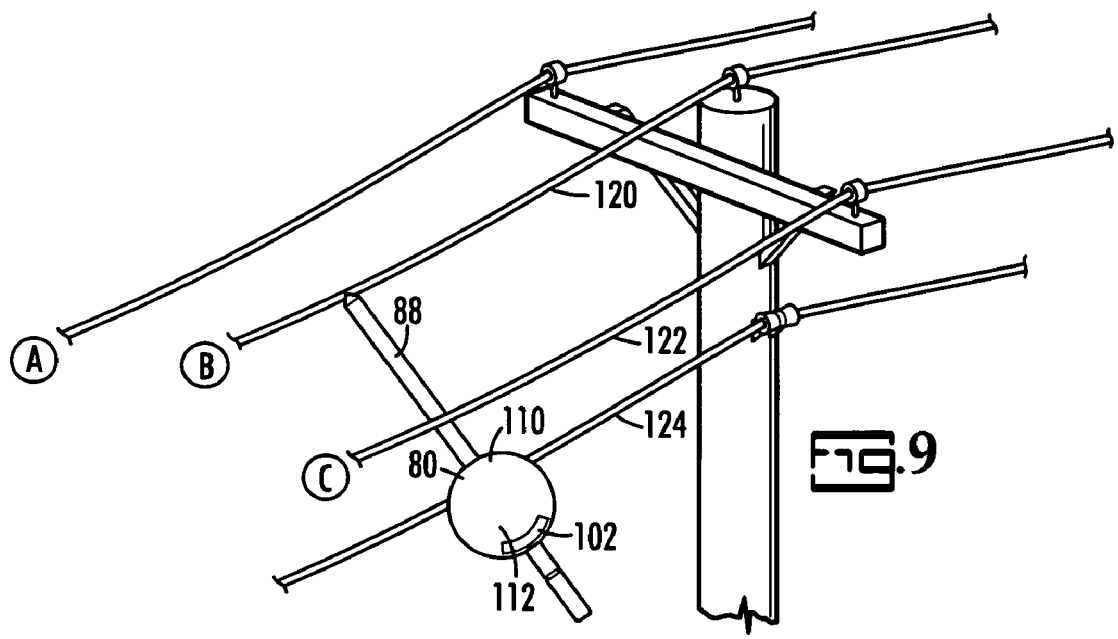
FIG. 9 illustrates the effects of a primary electric field on a voltage detector while being influenced by a second electric field (namely, an adjacent phase long wire) and a third electric field (namely, a neutral conductor long wire), according to a preferred embodiment of the present invention.

FIG. 6 represents the present voltage detector 80 with input/output electrode sensors 106, illustrated here as in FIGS. 7-9 for convenience as if there were no protective shell 108, measuring the voltage of point source 40 with probe 88. Point source 40 is the same as is shown in FIG. 2, namely, an insulated bushing protruding from a large electrically grounded all steel transformer case 42. If the field lines of FIG. 6 are compared to the field lines of FIG. 2, it will be seen that they are similar, namely, some field lines are coupled directly from front surface 110 of shielded housing 82 into steel transformer case 42. However, other field lines are now coupled from electrode sensors 106 incorporated into front surface 110 of the housing 82 to case 42. All four input/output electrode sensors 106 on front surface 110 of housing 82 in this situation are acting as output electrode sensors 106 measuring a portion of the AC capacitive charging current going out of front surface 110 of housing 82 to case 42. The remaining electrode sensors 106 are output sensors as indicated by field lines emanating from housing 82 of detector 80 to ground 52.

FIG. 7 illustrates the present detector 80 with its input/output sensors 106 while being held perpendicular to and measuring the voltage on long wire 56. A portion of the electric field couples directly from long wire 56 into front surface 110 of housing 82, including through two of electrodes sensors 106 incorporated into front surface 110 of housing 82. These two electrode sensors 106 in this illustration are acting as input sensors measuring a portion of the AC capacitive charging current coming into front surface 110 of housing 82. The remaining two electrode sensors 106 on front surface 110 will still serve as output sensors but at a reduced level when compared to the corresponding two of FIG. 6. The remaining field lines couple from back surface 112 of detector 80 to ground 52. Electrode sensors 106 on back surface 112 are all output sensors as indicated by lead lines that extend to ground 52.

FIG. 8 represents the present invention with additional input/output sensors measuring a voltage while being held perpendicular to a physically large bus bar. Notice a greater portion of the electric field couples directly from the physically large bus into the front portion of the shielded housing and into all four of the electrodes incorporated into the front portion of the housing. All four sensors 106 on front surface 110 of housing 82 in this situation act as input sensors; sensors 106 on back surface 112 of housing continue to act as output sensors as indicated by lead lines that run from housing 82 to ground 52. Microprocessor can now compensate for the error introduced as a result of the charging current entering front surface 110 of shielded housing 82 and partially bypassing the high voltage dropping resistor 96 in probe 88.

FIG. 9 represents the present voltage detector 80 with eight input/output sensors 106 being held perpendicular to and measuring the voltage on a long wire (B phase) voltage source 120. The present invention is also being exposed to an adjacent phase (C phase) long wire 122 from the top and rear and a neutral conductor 124 (at near ground potential) from the bottom and rear. The AC charging current sensed in the input/output electrode 106 near the adjacent phase C long wire 122 will be recognized by microprocessor 1 as a different phase and the primary voltage indication adjusted downward accordingly. Likewise the AC charging current sensed by the input/output electrode 106 closest to neutral conductor 124 will be recognized by microprocessor 100 as large when compared to those sensors 106 on the opposing side of housing 82 and the primary voltage indication from contacting probe 80 to long wire 120 is adjusted downward by microprocessor 100 in view of the currents sensed by electrodes 106.

Figure 10:
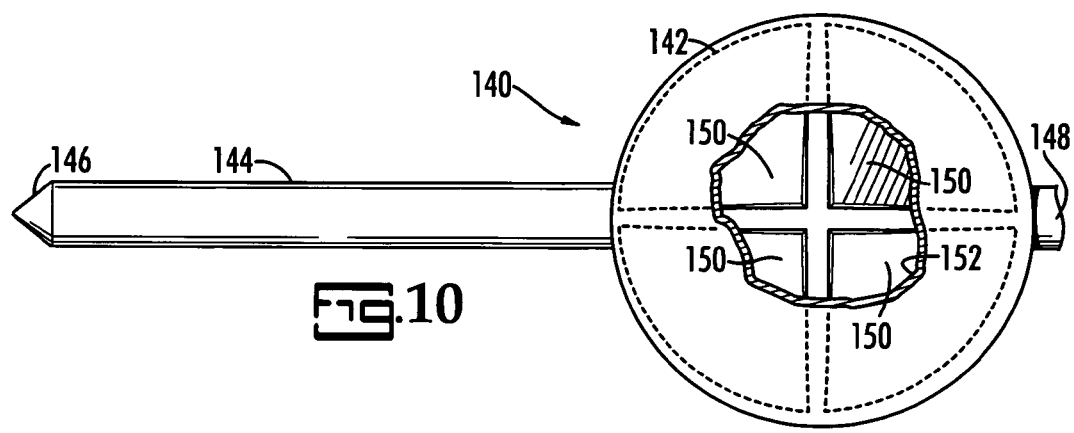
FIG. 10 illustrates an alternative voltage detector, according to a preferred embodiment of the present invention.

FIG. 10 represents a different embodiment of the present voltage detector 140. Detector 140 has a housing 142, a probe 144 with a conducting tip 146 and a handle 148. Detector 140 also has non-contact electrode sensors 150 that, unlike the "button" shaped sensors 106 shown in FIGS. 5-9, are maximized to nearly fill one-eighth of housing 142. An insulated protective shell 152, shown partly cut-away in FIG. 10, covers sensors 150 Housing 142 does not have to be spherically shaped, of course, but sensors 150 should cover approximately equal areas of its surface, regardless of its shape. Each sensor 150 is electrically isolated and insulated from the others but closely spaced so collectively they form an equivalent electromagnetic shield 84. Each sensor 150 as before is connected to microprocessor 100, shown in FIG. 5b. Each sensor electrode 150 may be formed by spray painting the inside of the housing with the same type of conductive paint used to form the electrostatic shield in a conventional voltage detector but applied to produce a pattern that leaves insulating strips between each sensor electrode 150. It may also be accomplished by attaching conductive inserts to the wall of the housing 142 in a pattern that provides an insulating strip between the sections. Each isolated individual electrode sensor 150 is then attached through proper scaling resistors 104 to microprocessor 100.

Each electrode sensor 106, 150, has its own scaling voltage divider network 104. Each input from a sensor 106, 150, is scaled and then fed to microprocessor 100 through an analog-to-digital converter 108 where the individual signals are conditioned and converted to digital signal for combining. Because each electrode sensor 106, 150 is an input/output, bi-directional electrode, the digital signals can add or subtract to the signal from probe 88, 144, depending on whether the AC input signal from any particular auxiliary electrode sensor 106, 150, is in phase with the AC signal on probe 88, 144 or our of phase. If charging current is going into sensor 106, 150, it is acting as an input sensor. If the AC input signal on the same electrode is 180 degrees out of phase with the AC signal on probe 88, 144, charging current is going out of sensor 106, 150 and it is then acting as an output sensor. The direction of the arrows on the electric force lines in the figures indicates whether sensors 106 are acting as input or output sensors.

In phase or 180 degrees out of phase indicates the auxiliary electrode is being acted upon by either the same source voltage (long wire or large flat bus) or a ground, respectively. If the phase angle of the AC voltage signal on the auxiliary electrode is either 120 degrees or 240 degrees removed from the AC voltage signal on main probe, the auxiliary electrode is sensing another phase.

Once calibrated, the voltages sensed by sensors 106, 150 contribute to the voltage sensed by probe 88, 144. Assume the voltage detected by probe 88, 144, is displayed in a range of 0 to 140 volts and each of the auxiliary electrode sensors 106, 150, can raise or lower probe 88, 144, input by up to +/−10 volts. If probe 88, 144, detector 80, 140, is put in contact with and held perpendicular to an energized long wire and the correct voltage should be indicated as 100 volts on the display but the effect of the long wire is to reduce the indication to 90 volts, then any two electrode sensors 106, 150, in alignment with the conductor would each raise the input by 5 volts each for a total of 100 volts. If none of the four electrode sensors 106, 150, are in alignment with the long wire, each would ideally add two and one half volts for a total of 100 volts.

If probe 88, 144, of detector 80, 140, is placed in contact with but not perpendicular to the energized long wire, say, at an angle of 45 degrees, the effect would be to reduce the voltage indication to an even lower value of say 84 volts. The electrode sensor 106, 150, in alignment with and closest to the long wire would now add ten volts to the voltage indication and electrodes 106, 150, above and below but not in alignment would add 3 volts each because of their closer proximity to the conductor, and the voltage indication would remain at 100 volts.

The worse case condition would be a large flat bus. If probe 88, 144, is held perpendicular to and put in contact with an energized large flat surface, the effect would be to reduce the voltage to say 80 volts. Each of the four electrode sensors 106, 150, would add 5 volts each for a total of 100 volts.

If probe 88, 144, is held at 45 degrees from an energized flat surface, the effect would be to reduce the voltage indication even further to, say, 74 volts. The electrode sensor 106, 150, closest to the flat surface would add 10 volts and the next two closest electrode sensors 106, 150, would add eight volts each for a total of 100 volts.

In all of the foregoing examples, the auxiliary electrode sensors 106, 150, closest to the source are sensing input AC charging current from a conductor of the same phase as the AC signal on the main probe. Any grounded conductor or surface brought into close proximity of detector 80, 140, would cause the reverse of this to happen. For example, a grounded conductor or surface can cause a voltage of 100 volts to indicate 110 volts on detector 140. In this situation the auxiliary electrode sensors 106, 150, closest to the grounded conductor or surface would now sense an output charging current 180 degrees out of phase with that detected by probe 80, 140, and adjust the indicated voltage down to 100 volts.

Figure 11:
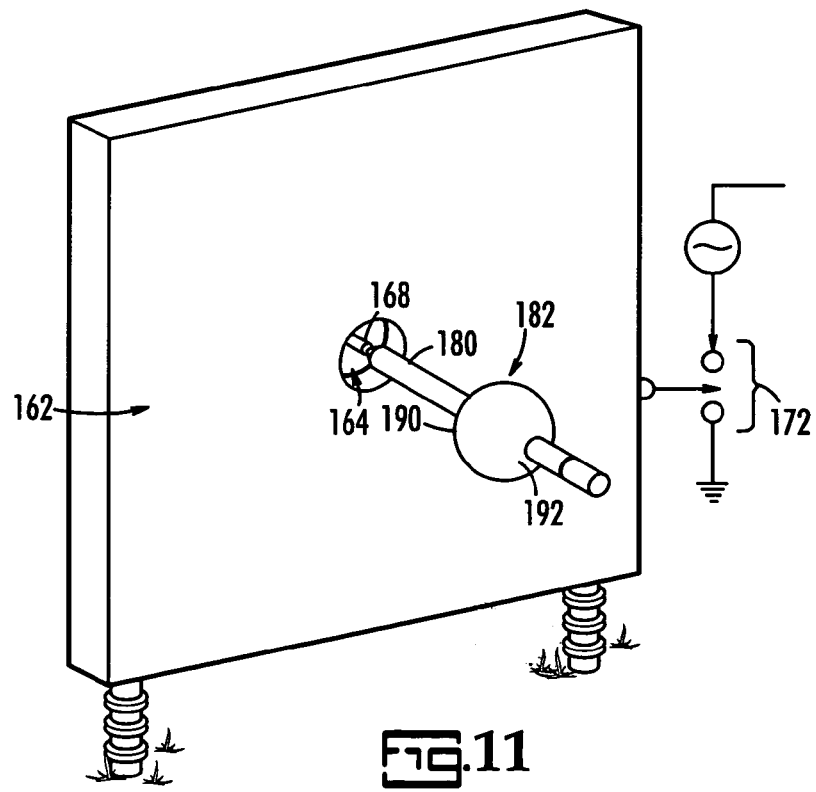
FIG. 11 illustrates a calibrating device for the present voltage detector, according to a preferred embodiment of the present invention.

A device for calibrating probe 80, 140, is illustrated in FIG. 11. Device 160 is a large, rectangular conductive surface 162 having an area extending over several square feet with a hole 164 formed therein. A conductor 168 not larger than the end of an electrically conductive wire, that is, smaller in diameter than said probe is positioned in the center of hole 164 so that it is not touching surface 162. Surface 162 is insulated from ground and other sources of electricity and electric fields but is connected to a switch 172 having a first position that connects surface 162 to ground and a second position that connects surface 162 to the same voltage as conductor 168.

A probe 180 of a detector 182 produces an output that is scaled to produce an arbitrary range of voltages such as 60 to 140 volts AC as input to microprocessor 100 when 100 volts AC is applied to the tip of the main probe. The actual voltage produced will depend on the proximity of voltage detector 182 to ground or other sources of voltage. Each electrode sensor 184 is also scaled to produce a range of voltages representing +/−10 volts AC. The actual voltage produced by each electrode sensor 184 will also depend on its proximity to ground or sources of voltage.

Step 1 of the calibration process is performed as follows. Surface 162 is grounded and probe 180 of voltage detector 182 is brought into contact with conductor 168. Electrode sensors 184 are now at higher potential than their surroundings and surface 162. Therefore, the direction of the AC charging current is from the front portion four electrodes to surface 162.

The probe 180 output is scaled to represent 120 volts on display 188 after processing by the microprocessor (not shown in FIG. 11) in detector 182. Each of the four electrode sensors 184 on a front portion 190 of detector 182 are then scaled to represent −5 volts, using a feature of display 188 that allows individual sensor 184 voltages to be seen. When the voltages of sensors 184 on front portion 190 of detector 182 are added to the 120 volts of probe 180, the result is 100 volts as displayed.

Next, in step 2, switch 172 is moved to the position that connects it to a source of voltage, namely 100 volts, the same as produced by conductor 168. Electrode sensors 184 on front portion 190 are now at lower potential than surface 162 so the direction of the AC charging current is from surface 162 to electrode sensors 184 on front portion 190.

Probe 180 should now be delivering approximately 80 volts into the microprocessor. Accordingly, each of the four sensors 184 on front portion 190 of detector 182 are adjusted to +5 volts, so that the display of detector 182 reads 100 volts.

In step three, electrode sensors 184 on back portion 192 are adjusted switching switch 172 to ground and by then removing the microprocessor inputs for each of the four sensors 184 on front portion 190 and replacing them with the four inputs for sensors 184 on back portion 192. Sensors 184 are now at a higher potential than surface 162. The charging current then flows from sensors 184 on rear 192 to the grounded surface 162. With source 168 are 100 volts, probe 180 of detector 182 should read approximately 120, so each sensor 184 is adjusted to −5 volts so that voltage detector 182 reads 100 volts.

In step 4, switch 172 is moved from ground to 100 volts AC, which drops the voltage sensed by probe 180 to 80 volts. After adjusting the four electrode sensors 184 to +5 volts, the detector will read 100 volts. Then the inputs for sensors 184 from back portion 192 of detector 180 to the microprocessor are returned to their previous locations and the inputs for sensors 184 from front portion 190 are reattached.

The ratio of 100 volts on the contract electrode to plus or minus 10% of that voltage on the non-contact electrodes used in the calibration examples is representative, with the exact ratio depending on the size of the detector and the spacing of the terminals on the detector, among other factors. Regardless of the ratio, the principal and the calibration procedure remains the same.

It is intended that the scope of the present invention include all modifications that incorporate its principal design features, and that the scope and limitations of the present invention are to be determined by the scope of the appended claims and their equivalents. It also should be understood, therefore, that the inventive concepts herein described are interchangeable and/or they can be used together in still other permutations of the present invention, and that other modifications and substitutions will be apparent to those skilled in the art from the foregoing description of the preferred embodiments without departing from the spirit or scope of the present invention.

What is claimed is:

1. A voltage detector, comprising:
   a housing with a handle;
   electrical shielding carried within said housing;
   a probe attached to and extending from said housing;
   an electrically conductive tip carried by said probe;
   a dropping resistor for reducing voltage detected by said electrically conductive tip when said tip contacts a source of voltage and producing an output signal;
   plural electrode sensors for sensing capacitive charging currents flowing to and from said detector, each electrode sensor of said plural electrode sensors producing an output signal;
   a microprocessor for receiving output signals from said probe through said dropping resistor and from said each electrode sensor of said plural electrode sensors, said microprocessor combining said output signals to produce a detected voltage of said voltage source; and a display, said display receiving said detected voltage from said microprocessor and displaying said detected voltage of said voltage source.

2. The voltage detector as recited in claim 1, further comprising a scaling resistor positioned between said microprocessor and said each electrode sensor for scaling the output signal of said each electrode sensor.

3. The voltage detector as recited in claim 1, further comprising a scaling resistor positioned between said dropping resistor and said microprocessor for scaling said output signal from said dropping resistor.

4. The voltage detector as recited in claim 1, wherein said plural electrode sensors are deployed over said housing.

5. The voltage sensor as recited in claim 1, wherein said housing is divided into plural areas, one electrode sensor in each area of said plural areas.

6. The voltage sensor as recited in claim 5, wherein said each electrode sensor extends over a majority of said each area of said plural areas.

7. The voltage detector as recited in claim 1, wherein said microprocessor combines said output signals of said each electrode sensor to said output signal of said dropping resistor by adding said output signal of said each electrode sensor to said output signal of said dropping resistor.

8. The voltage detector as recited in claim 1, further comprising a non-conducting shell over said housing.

9. A method of detecting an unknown voltage using the voltage detector recited in claim 1, comprising the steps of:
   contacting an electrical wire to a source of electricity;
   placing said probe tip against said electrically conducting wire;
   determining said output voltage of said dropping resistor when said probe tip is against said electrically conducting wire;
   scaling said output voltages of said plural electrode sensors when said probe tip is in contact with said electrically conducting wire so that said plural electrode sensors add zero voltage to said output voltage of said dropping resistor;
   connecting a large electrically conducting surface to said source of electricity, said source extending over an area of several square feet and having a hole formed therein wherein said electrically conductive wire is positioned;
   scaling said output of said each electrode sensor so that, when said output voltage of said each electrode sensor is combined with said output voltage of said dropping resistor, said voltage signal from said microprocessor equals said output voltage of said dropping resistor when said electrically conducting surface was not connected to said source of electricity; and
   placing said probe tip in contact with an unknown source of electricity to determine a voltage of said unknown voltage from said voltage signal.

10. The method as recited in claim 9, wherein said housing has a front surface including said probe and a back surface including said handle and said plural electrode sensors are deployed evenly over said housing, and where second scaling step is done for said electrode sensors on said front surface only and then repeated for said electrode sensors for said back surface only.

11. The method as recited in claim 9, wherein said microprocessor has inputs for said each electrode sensor of said housing and wherein said inputs for said electrode sensors in said front portion are used for said second scaling step when repeated for said electrode sensors of said back portion.

* * * * *